US010141235B2

(12) United States Patent
Kiyosawa

(10) Patent No.: US 10,141,235 B2
(45) Date of Patent: Nov. 27, 2018

(54) SEMICONDUCTOR DEVICE AND METHOD FOR MANUFACTURING THE SAME

(71) Applicant: Panasonic Intellectual Property Management Co., Ltd., Osaka (JP)

(72) Inventor: Tsutomu Kiyosawa, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/911,231

(22) Filed: Mar. 5, 2018

(65) Prior Publication Data

US 2018/0277453 A1    Sep. 27, 2018

(30) Foreign Application Priority Data

Mar. 21, 2017    (JP) .................... 2017-054486

(51) Int. Cl.
*H01L 29/66* (2006.01)
*H01L 21/66* (2006.01)
(Continued)

(52) U.S. Cl.
CPC .......... *H01L 22/22* (2013.01); *H01L 21/8213* (2013.01); *H01L 21/8252* (2013.01); *H01L 23/5226* (2013.01); *H01L 29/1037* (2013.01); *H01L 29/1095* (2013.01); *H01L 29/66* (2013.01); *H01L 29/66712* (2013.01); *H01L 29/7802* (2013.01); *H01L 29/7827* (2013.01); *H01L 29/1608* (2013.01); *H01L 29/2003* (2013.01)

(58) Field of Classification Search
CPC ............. H01L 29/7827; H01L 29/1095; H01L 29/1037; H01L 29/66674; H01L 29/66; H01L 22/22; H01L 29/7802; H01L 21/8213; H01L 29/2003; H01L 23/5226; H01L 29/1608; H01L 21/8252
See application file for complete search history.

(56) References Cited

U.S. PATENT DOCUMENTS

2010/0283126 A1    11/2010   Kiriyama et al.
2014/0097863 A1*    4/2014   Zundel ................... H01L 22/34
                                                                  324/762.01
(Continued)

FOREIGN PATENT DOCUMENTS

WO         2009/088081         7/2009

*Primary Examiner* — Savitr Mulpuri
(74) *Attorney, Agent, or Firm* — McDermott Will & Emery LLP

(57) ABSTRACT

Semiconductor layer 110 is formed on semiconductor substrate 101. Semiconductor layer 110 has a plurality of well regions 103 in a surface remote from semiconductor substrate 101. Semiconductor layer 110 includes drift region 102 in addition to the plurality of well regions 103. The plurality of well regions 103 each include body region 105, source region 108, and contact region 109. Source region 108 is in contact with body region 105. Contact region 109 is in contact with both body region 105 and source region 108. Body region 105, source region 108, and source wire 118 are at an identical potential because of contact region 109. Semiconductor layer 110 includes ineffective region R at the surface remote from semiconductor substrate 101.

2 Claims, 13 Drawing Sheets

(51) Int. Cl.
*H01L 29/78* (2006.01)
*H01L 21/82* (2006.01)
*H01L 23/522* (2006.01)
*H01L 21/8252* (2006.01)
*H01L 29/10* (2006.01)
*H01L 29/20* (2006.01)
*H01L 29/16* (2006.01)

(56) References Cited

U.S. PATENT DOCUMENTS

| | | | |
|---|---|---|---|
| 2016/0064476 A1* | 3/2016 | Kobayashi | H01L 29/7397 257/139 |
| 2016/0149025 A1* | 5/2016 | Mori | H01L 29/4925 257/77 |
| 2017/0084611 A1* | 3/2017 | Iwasaki | H01L 29/7397 |

* cited by examiner

SEMICONDUCTOR DEVICE AND METHOD FOR MANUFACTURING THE SAME

BACKGROUND

1. Technical Field

The present disclosure relates to a semiconductor device and a method for manufacturing the semiconductor device.

2. Description of the Related Art

In recent years, the development of semiconductor devices for power electronics applications has been promoted. Power semiconductor devices have large-area semiconductor chips, and these large-area semiconductor chips are apt to contain defects. This decreases the yield of the semiconductor devices. To address this problem, various traditional technologies have been presented to prevent the defects from causing a reduction in yield, as is disclosed in PTL 1.

CITATION LIST

Patent Literature

PTL 1: WO 2009/088081 A

SUMMARY

The present disclosure provides a new technology that prevents defects from causing a reduction in yield.

A semiconductor device according to an aspect of the present disclosure includes a semiconductor substrate, a semiconductor layer, a gate insulating layer is disposed on the semiconductor layer, a gate electrode, an insulating film, and a source wire. The semiconductor layer is disposed on the semiconductor substrate. The semiconductor layer has a plurality of well regions in a surface remote from the semiconductor substrate and includes a drift region. The semiconductor layer includes an ineffective region at the surface remote from the semiconductor substrate. The well regions each include a source region. The gate insulating layer is disposed on the semiconductor layer. The gate insulating layer exposes at least part of each of the source regions of the plurality of well regions both inside and outside the ineffective region. The gate electrode is disposed on the gate insulating layer outside the ineffective region, whereas the gate electrode is not disposed on the gate insulating layer inside the ineffective region. The insulating film is covered the gate electrode outside the ineffective region and is covered at least part of the gate insulating layer inside the ineffective region. The source wire is put on the insulating film both inside and outside the ineffective region. The source wire is in contact with the exposed at least parts of each of the source regions of the plurality of well regions.

A semiconductor device according to another aspect of the present disclosure includes a semiconductor substrate, a semiconductor layer, a gate insulating layer, a gate electrode, an insulating film, and a source wire. The semiconductor layer is disposed on the semiconductor substrate. The semiconductor layer has a plurality of well regions in a surface remote from the semiconductor substrate and includes a drift region. The semiconductor layer includes an ineffective region at the surface remote from the semiconductor substrate. The well regions each include a source region. The gate insulating layer is disposed on the semiconductor layer. The gate insulating layer exposes at least part of each of the source regions of the plurality of well regions outside the ineffective region and exposes none of the source regions of the plurality of well regions inside the ineffective region. The gate electrode is disposed on the gate insulating layer both inside and outside the ineffective region. The insulating film is covered the gate electrode outside the ineffective region and is covered the gate electrode and at least part of the gate insulating layer inside the ineffective region. The source wire is covered the insulating film both inside and outside the ineffective region. The source wire is in contact with the exposed source regions of the plurality of well regions outside the ineffective region.

A method for manufacturing a semiconductor device according to another aspect of the present disclosure includes a first step, a second step, a third step, a fourth step, a fifth step, and a sixth step. In the first step, the method includes preparing a semiconductor substrate, a semiconductor layer disposed on the semiconductor substrate, a gate insulating layer disposed on the semiconductor layer, and a gate electrode disposed on the gate insulating layer. The semiconductor layer has a plurality of well regions in a surface remote from the semiconductor substrate and includes a drift region. The well regions each include a source region. In the second step, the method includes removing part of the gate electrode overlapping each of the source regions of the plurality of well regions. In the third step, the method includes inspecting a defect produced in any of the first and the second steps, recording coordinates of the defect, and determining an ineffective region based on the coordinates of the defect. In the fourth step, the method includes removing the gate electrode in the ineffective region. In the fifth step, the method includes forming an insulating film on the gate electrode outside the ineffective region and forming the insulating film on at least part of the gate insulating layer inside the ineffective region. The method further includes forming two or more source contact holes in the insulating film both inside and outside the ineffective region so as to expose at least part of each of the source regions of the plurality of well regions. In the sixth step, the method includes forming a source wire such that the source wire is covered the insulating film and is in contact with the exposed source regions of the plurality of well regions through the source contact holes both inside and outside the ineffective region.

A method for manufacturing a semiconductor device according to another aspect of the present disclosure includes a first step, a second step, a third step, a fourth step, and a fifth step. In the first step, the method includes preparing a semiconductor substrate, a semiconductor layer disposed on the semiconductor substrate, a gate insulating layer disposed on the semiconductor layer, and a gate electrode disposed on the gate insulating layer. The semiconductor layer has a plurality of well regions in a surface remote from the semiconductor substrate and includes a drift region. The well regions each include a source region. In the second step, the method includes removing part of the gate electrode overlapping each of the source regions of the plurality of well regions. In the third step, the method includes inspecting a defect produced in any of the first and the second steps, recording coordinates of the defect, and determining an ineffective region based on the coordinates of the defect. In the fourth step, the method includes putting an insulating film on the gate insulating layer and the gate electrode formed through the second step both inside and outside the ineffective region. The method further includes forming two or more source contact holes in the insulating film outside the ineffective region so as to expose at least part of each of the source regions of the plurality of well regions outside the ineffective region and forming no such source contact hole in the insulating film inside the ineffective region. In the fifth step, the method includes forming a source wire such that the source wire is covered the insulating film both inside and outside the ineffective region and is in contact with the exposed source regions of the plurality of well regions through the source contact holes outside the ineffective region.

The aspects of the present disclosure described above may be implemented, either comprehensively or specifically, by a system, a procedure, an integrated circuit, a computer program, or a storage medium. Alternatively, they may be implemented by any desired combinations of a system, an apparatus, a procedure, an integrated circuit, a computer program, and a storage medium.

The technique provided by the present disclosure prevents a defect from causing a reduction in yield.

BRIEF DESCRIPTION OF THE DRAWINGS

FIG. 8A is an optical microscope photograph of gate electrode 113 having sticking conductive particle 121a.

DETAILED DESCRIPTION

Knowledge that Underlies the Present Disclosure

Prior to describing an exemplary embodiment of the present disclosure, knowledge that underlies the present disclosure will now be described.

It is desirable that semiconductor chips extracted from semiconductor wafers by epitaxial growth should each have an area of several centimeters square to implement a high current of several hundred amperes in power devices. However, securing the yield for large-area power devices is not easy. Following, semiconductor wafer by epitaxial growth is denoted 'epi wafer'.

For example, silicon carbide (SiC) epi wafers for power devices contain many crystalline defects such as stacking faults and downfall. Even at present, the quality of SiC epi wafers has not reached a satisfactory level. Commercially available epi wafers have defect density of about 0.5 to several pieces/cm$^2$. If devices of 1 cm square are made using a SiC epi wafer with defect density of 1 piece/cm$^2$, the yield on the epi wafer is estimated at around 50% in the Seeds model. According to the Seeds model, estimated yield Y is given by: $Y=1/(1+AD)$, where A is the chip area and D is the defect density.

PTL 1 discloses a semiconductor device including a semiconductor substrate, an insulating film, and an electric conductive film, and a method for manufacturing the semiconductor device to present a technology that prevents a crystalline defect in the semiconductor substrate from causing a reduction in yield. The semiconductor substrate has a defective region containing a crystalline defect. The insulating film is disposed on the semiconductor substrate so as to cover the defective region. The electric conductive film is electrically connected to a part of a main surface of the semiconductor substrate in which the part of the main surface is exposed to a region not covered with the insulating film.

The insulating film covers the defective region such that the electric conductive film and the defective region are electrically insulated from each other. This configuration allows electric current to flow only through a region other than the region of the crystalline defect in the semiconductor substrate. In other words, the crystalline defect does not influence electrical characteristics of the semiconductor device. This prevents a reduction in the yield of the semiconductor device.

Unfortunately, PTL 1 makes no reference to reduction in the yield owing to process-related defects. Making of power devices using an epi wafer can result in process-related defects such as sticking particles and pattern defects in addition to crystalline defects.

To show an example of a power device containing process-related defects, a metal oxide semiconductor field effect transistor (hereinafter referred to as a power MOSFET) will now be described.

Figure 7A:
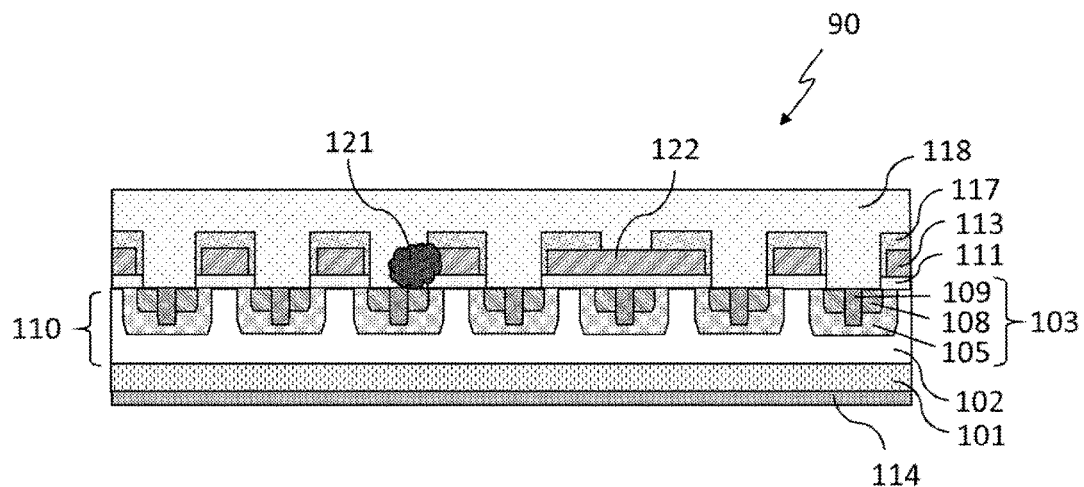
FIG. 7A is a schematic cross-sectional view illustrating an example configuration of power MOSFET 90 containing process-related defect 121, 122.
Figure 7B:
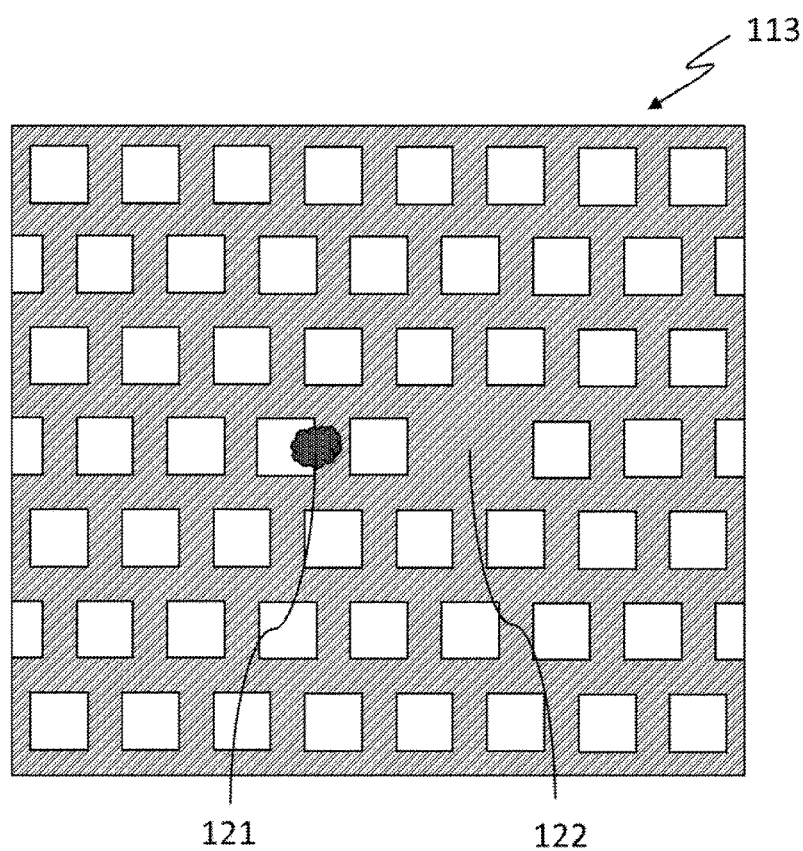
FIG. 7B is a schematic top view illustrating an example configuration of gate electrode 113 in power MOSFET 90 containing process-related defects 121, 122.

FIG. 7A is a schematic cross-sectional view illustrating an example configuration of power MOSFET 90 containing process-related defect 121, 122. FIG. 7B is a schematic top view illustrating an example configuration of gate electrode 113 in power MOSFET 90 containing process-related defects 121, 122.

The following description is focused on a region other than the region of process-related defects 121, 122 in power MOSFET 90.

Power MOSFET 90 includes semiconductor substrate 101, semiconductor layer 110, gate insulating layer 111, gate electrode 113, insulating film 117, source wire 118, and drain electrode 114. Semiconductor layer 110 includes a plurality of well regions 103 and drift region 102. The plurality of well regions 103 each includes body region 105, source region 108, and contact region 109. The configuration described above is the same as the configuration of power MOSFETs according to conventional techniques.

Well regions 103 are two-dimensionally distributed in a surface of semiconductor layer 110 remote from semiconductor substrate 101. Gate electrode 113 has a mesh of a plurality of holes (see FIG. 7B). Each hole in gate electrode 113 is smaller than each well region 103. The holes of gate electrode 113 are disposed over respective well regions 103. Gate electrode 113 near each hole partly overlaps body regions 105 of well regions 103 through gate insulating layer 111.

Let us assume that a voltage is applied between drain electrode 114 and source wire 118 in power MOSFET 90. For example, drain electrode 114 is at a potential of several volts (V) and source wire 118 is at a potential of 0 V. If no voltage is applied to gate electrode 113, no electric current flows between source wire 118 and drain electrode 114 (an off-state). Meanwhile, if a voltage is applied to gate electrode 113, a channel region is formed both at an interface between body regions 105 and gate insulating layer 111 and an interface between drift region 102 and gate insulating layer 111. This enables an electric current to flow between drift region 102 and source regions 108 via the channel regions. In other words, a voltage applied to gate electrode 113 causes an electric current to flow between source wire 118 and drain electrode 114 (an on-state).

Figure 8A:
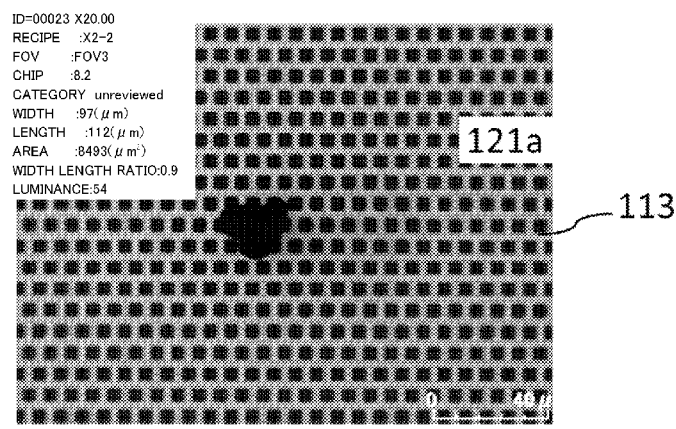
Figure 8B:
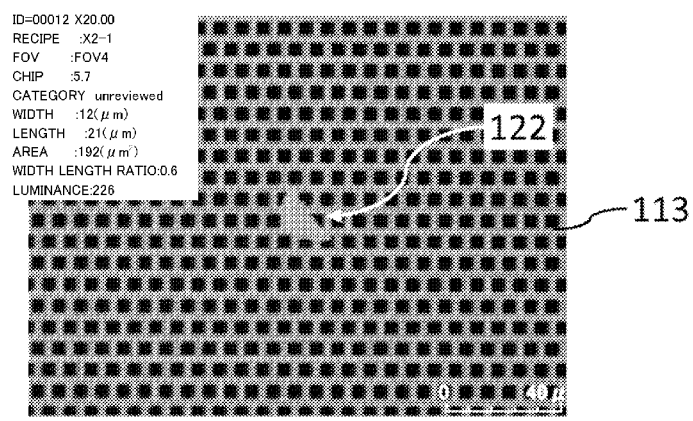
FIG. 8B is an optical microscope photograph of gate electrode 113 having pattern defect 122.

In reality, however, as shown in FIGS. 8A and 8B, at least one of sticking conductive particle 121a (a foreign substance) and pattern defect 122 in gate electrode 113 can be produced in a process of gate wiring. Gate electrode 113 and source wire 118 are electrically connected to each other via conductive particle 121a. Pattern defect 122 in gate electrode 113 puts gate electrode 113 and source wire 118 into direct contact with each other. Such process-related defect 121, 122 leads to a failure of gate leakage, that is a leakage current flowing between a gate and a source. This hampers a channel region from being formed at the interface between body regions 105 and gate insulating layer 111 even if a voltage is applied to gate electrode 113. As a result, an electric current flowing between source wire 118 and drain electrode 114 drops or reaches substantially zero. This in turn disables the implementation of an on-state. In other words, this failure prevents the power device from having desired device characteristics and reduces a yield for power MOSFET 90.

Next, optical microscope photographs of actual process-related defects will be shown.

FIG. 8A is an optical microscope photograph of gate electrode 113 having sticking conductive particle 121a. FIG. 8B is an optical microscope photograph of gate electrode 113 having pattern defect 122. In the example configuration of FIGS. 7A and 7B, relatively small process-related defects 121, 122 are shown. In reality, with reference to FIGS. 8A and 8B, process-related defects 121, 122 each occupy a large region that covers a plurality of holes in gate electrode 113. Thus, a yield reduction due to process-related defects 121, 122 cannot be disregarded.

Generally, epi wafers including SiC, gallium nitride (GaN), or other material used for power devices are very costly. It is desirable to prevent not only crystalline defects but also process-related defects from causing a reduction in yield so that the yield of power devices having large-area chips is secured.

Based on the knowledge described above, the inventor of the present disclosure has arrived at a semiconductor device and a method for manufacturing the semiconductor device as specified in the following items.

[Item 1]
A semiconductor device comprising:
a semiconductor substrate;
a semiconductor layer disposed on the semiconductor substrate, the semiconductor layer comprising:
  a plurality of well regions in top portions remote from the semiconductor substrate, the plurality of well regions each including a source region;
  a drift region in a part other than the plurality of well regions; and
  an ineffective region at the surface remote from the semiconductor substrate;
a gate insulating layer disposed on the semiconductor layer, the gate insulating layer exposing at least part of each of the source regions of the plurality of well regions both inside and outside the ineffective region;
a gate electrode disposed on the gate insulating layer outside the ineffective region, the gate electrode being not disposed inside the ineffective region;
an insulating film put on the gate electrode outside the ineffective region, the insulating film being put on at least part of the gate insulating layer inside the ineffective region; and
a source wire put on the insulating film both inside and outside the ineffective region, the source wire being in contact with the exposed at least portions of each of the source regions of the plurality of well regions.

[Item 2]
The semiconductor device according to item 1, wherein an conductive or non-conductive foreign substance exists at least one of above, below, and inside the gate insulating layer within the ineffective region.

[Item 3]
A semiconductor device comprising:
a semiconductor substrate;
a semiconductor layer disposed on the semiconductor substrate, the semiconductor layer comprising:
  a plurality of well regions in top portions remote from the semiconductor substrate, the plurality of well regions each including a source region;
  a drift region in a part other than the plurality of well regions; and
  an ineffective region at the surface remote from the semiconductor substrate;
a gate insulating layer disposed on the semiconductor layer, the gate insulating layer exposing at least part of each of the source regions of the plurality of well regions outside the ineffective region and exposing none of the source regions of the plurality of well regions inside the ineffective region;
a gate electrode disposed on the gate insulating layer both inside and outside the ineffective region;
an insulating film covered the gate electrode outside the ineffective region, the insulating film being covered the gate electrode and at least part of the gate insulating layer inside the ineffective region; and
a source wire put on the insulating film both inside and outside the ineffective region, the source wire being in contact with the exposed source regions of the plurality of well regions outside the ineffective region.

[Item 4]
The semiconductor device according to item 3, wherein an conductive or non-conductive foreign substance exists at least one of above, below, and inside the gate insulating layer within the ineffective region.

[Item 5]
The semiconductor device according to either item 3 or 4, wherein the gate electrode overlaps at least part of one of the source regions of the plurality of well regions through the gate insulating layer inside the ineffective region.

[Item 6]
A method for manufacturing a semiconductor device, the method comprising:
a first step of preparing:
a semiconductor substrate;
a semiconductor layer disposed on the semiconductor substrate, the semiconductor layer comprising:
  a plurality of well regions in a surface remote from the semiconductor substrate, the plurality of well regions each including a source region; and
  a drift region in a part other than the plurality of well regions;
a gate insulating layer disposed on the semiconductor layer; and
a gate electrode disposed on the gate insulating layer;
a second step of removing part of the gate electrode overlapping each of the source regions of the plurality of well regions;
a third step of inspecting a defect produced in any of the first and the second steps, recording coordinates of the defect, and determining an ineffective region based on the coordinates of the defect;
a fourth step of removing the gate electrode in the ineffective region;
a fifth step of forming an insulating film on the gate electrode outside the ineffective region, forming the insulating film on at least part of the gate insulating layer inside the ineffective region, and forming two or more source contact holes in the insulating film both inside and outside the ineffective region so as to expose at least part of each of the source regions of the plurality of well regions; and
a sixth step of forming a source wire such that the source wire is covered the insulating film and is in contact with the exposed source regions of the plurality of well regions through the source contact holes both inside and outside the ineffective region.

[Item 7]
A method for manufacturing a semiconductor device, the method comprising:
a first step of preparing:
a semiconductor substrate;
a semiconductor layer disposed on the semiconductor substrate, the semiconductor layer comprising:
  a plurality of well regions in top portions remote from the semiconductor substrate, the plurality of well regions each including a source region; and
  a drift region in a part other than the plurality of well regions;
a gate insulating layer disposed on the semiconductor layer; and
a gate electrode disposed on the gate insulating layer;
a second step of removing part of the gate electrode overlapping each of the source regions of the plurality of well regions;

a third step of inspecting a defect produced in any of the first and the second steps, recording coordinates of the defect, and determining an ineffective region based on the coordinates of the defect;

a fourth step of putting an insulating film on the gate insulating layer and the gate electrode formed through the second step both inside and outside the ineffective region, forming two or more source contact holes in the insulating film outside the ineffective region so as to expose at least part of each of the source regions of the plurality of well regions outside the ineffective region, and forming no source contact hole in the insulating film inside the ineffective region so as to expose none of the source regions of the plurality of well regions inside the ineffective region; and a fifth step of forming a source wire such that the source wire is covered the insulating film both inside and outside the ineffective region and is in contact with the exposed source regions of the plurality of well regions through the source contact holes outside the ineffective region.

This technique prevents a defect from causing a reduction in yield.

An exemplary embodiment of the present disclosure will now be described in detail. However, detailed descriptions that are more than necessary may be omitted. For example, the detailed description of well-known matters and repeated description of substantially the same configuration may be omitted. This is to avoid the following description from being unnecessarily redundant, and to facilitate understanding by those skilled in the art. The inventor of the present disclosure provides the appended drawings and the following description in order to allow those skilled in the art to fully understand the present disclosure, and does not intend to limit the subject matter described in the appended claims by the appended drawings and the following description. In the following description, components having identical or similar functions are denoted by the same reference numerals or symbols.

Exemplary Embodiment

The following description is focused on process-related defects as example defects.

Figure 1A:
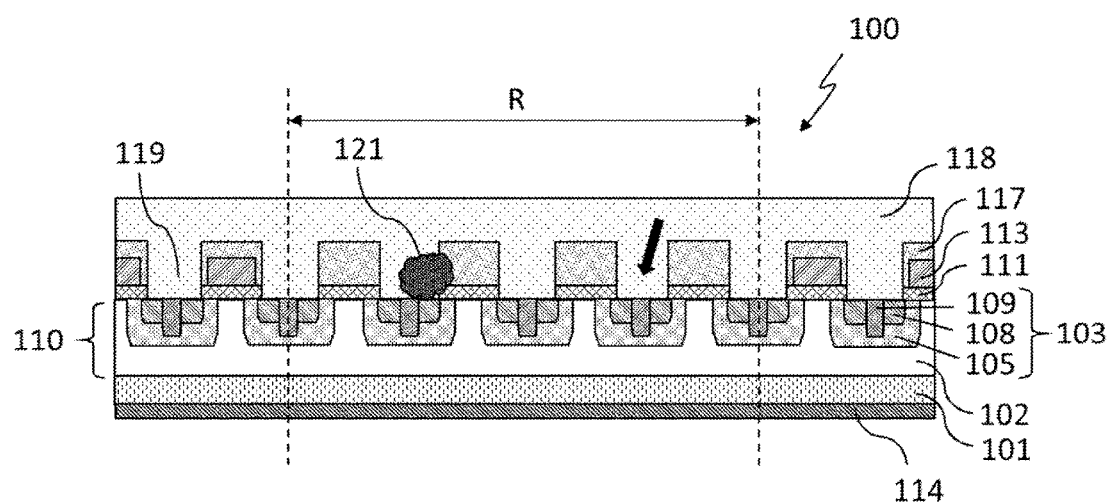
FIG. 1A is a schematic cross-sectional view illustrating an example configuration of power MOSFET 100 containing process-related defects according to an exemplary embodiment of the present disclosure.
Figure 1B:
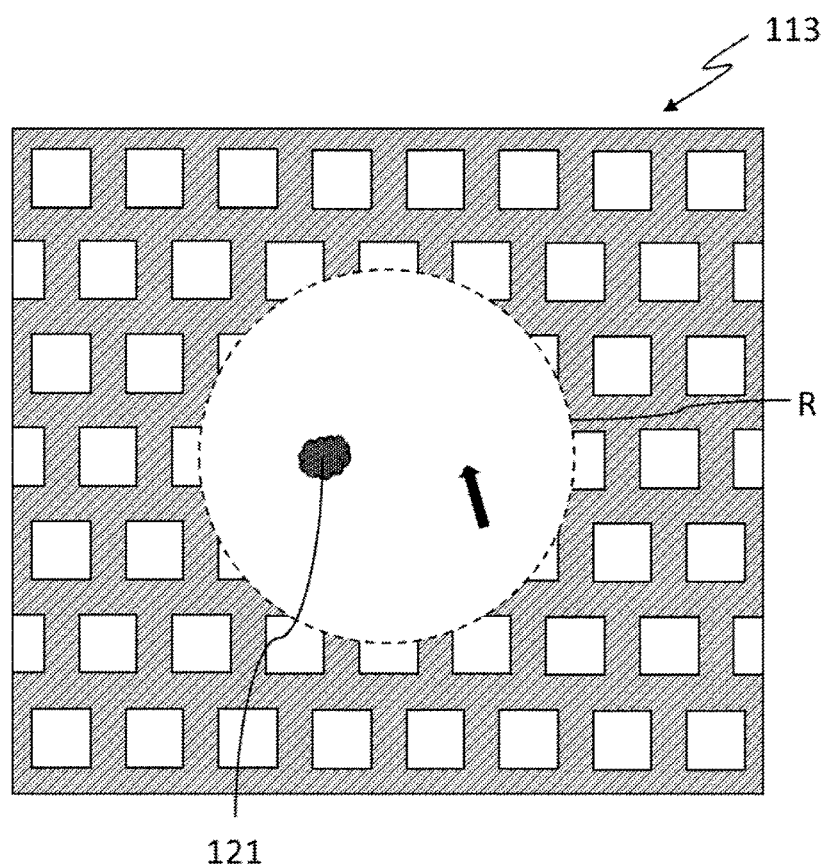
FIG. 1B is a schematic top view illustrating an example configuration of gate electrode 113 in power MOSFET 100 containing process-related defects according to the exemplary embodiment.

FIG. 1A is a schematic cross-sectional view illustrating an example configuration of power MOSFET 100 containing process-related defects according to the exemplary embodiment. FIG. 1B is a schematic top view illustrating an example configuration of gate electrode 113 in power MOSFET 100 containing process-related defects according to the exemplary embodiment. A bold arrow in the figure indicates a location where pattern defect 122 existed in gate electrode 113.

Power MOSFET 100 includes semiconductor substrate 101, semiconductor layer 110, gate insulating layer 111, gate electrode 113, insulating film 117, source wire 118, and drain electrode 114. In the following, detailed descriptions of components identical to those in the conventional technique may be omitted.

Semiconductor layer 110 is formed on semiconductor substrate 101 (e.g., an N$^+$ type SiC or GaN substrate). Semiconductor layer 110 has a plurality of well regions 103 in a surface remote from semiconductor substrate 101. Semiconductor layer 110 includes drift region 102 (e.g., an N$^-$ type drift region) in addition to the plurality of well regions 103. Well regions 103 each include body region 105 (e.g., a P$^+$ doped region), source region 108 (e.g., an N$^+$ doped region), and contact region 109. Source region 108 is in contact with body region 105. Contact region 109 is in contact with both body region 105 and source region 108. Body region 105, source region 108, and source wire 118 are at an identical potential because of contact region 109. Semiconductor layer 110 includes ineffective region R at the surface remote from semiconductor substrate 101.

In the present specification, the "ineffective region" represents not only a two-dimensional region on the surface of the semiconductor layer remote from the semiconductor substrate but also a three-dimensional region above and below the same surface.

Gate insulating layer 111 is formed on semiconductor layer 110. Gate insulating layer 111 exposes at least part of source region 108 and contact region 109 of every well region 103, (which corresponds to source contact hole 119), both inside and outside ineffective region R.

Gate electrode 113 is formed on gate insulating layer 111 outside ineffective region R. No gate electrode 113 is formed on gate insulating layer 111 inside ineffective region R.

Insulating film 117 is covered gate electrode 113 outside ineffective region R. Insulating film 117 is covered at least part of gate insulating layer 111 inside ineffective region R.

Source wire 118 is put on insulating film 117 both inside and outside ineffective region R. Source wire 118 is in contact with exposed source regions 108 and contact regions 109 of well regions 103 through source contact holes 119 both inside and outside ineffective region R. Locations where source wire 118 is in ohmic contact with exposed source regions 108 and contact regions 109 constitute a source electrode.

Drain electrode 114 is formed on a surface of semiconductor substrate 101 remote from semiconductor layer 110.

In the example configuration of FIG. 1A, conductive or non-conductive foreign substance 121 can exist at least one of above, below, and inside gate insulating layer 111 within ineffective region R. These foreign substances are any of environmental and equipment-borne particles at plants and residues of silicon dioxide ($SiO_2$), polycrystalline silicon (poly-Si), or other hardmasks used to form well regions. If a channel epitaxial layer (not shown) is formed between body regions 105 and gate insulating layer 111, any of deposits of polycrystals (e.g., polycrystalline SiC or GaN) in epitaxial growth devices for forming channel epitaxial layers can stick to the channel epitaxial layer.

A range of ineffective region R in a direction parallel to semiconductor substrate 101 may be defined by an edge that is at a predetermined distance from the location of a defect, for example. In the example configuration of FIG. 1B, the range of ineffective region R in the direction parallel to semiconductor substrate 101 is equivalent to an internal area of a circle indicated with a dotted line. A center of the circle is around a midpoint between foreign substance 121 and the location (the bold arrow in the figure) where pattern defect 122 existed in gate electrode 113. A radius of the circle is twice the distance between centers of two adjacent well regions 103. In reality, it is preferable that the edge of ineffective region R be at a distance of 5 μm or longer from every defect. Ineffective region R with a plurality of defects may have any shape other than one circle. For example, ineffective region R with a plurality of defects may be a region formed of overlapping circles that contain respective defects.

Ineffective region R is always in an off-state because of no formation of gate electrode 113 inside ineffective region R. In other words, no process-related defect inside ineffective region R causes a leakage current to flow between the gate and the source. This configuration prevents any process-related defect from causing a reduction in the yield of power MOSFET 100.

However, if ineffective region R is too large, power MOSFET 100 can be disabled from providing a desired high current. Thus, it is preferable that ineffective region R account for 10% or less of a total region of gate electrode 113.

Gate electrode 113 may not entirely be removed in ineffective region R.

Figure 1C:
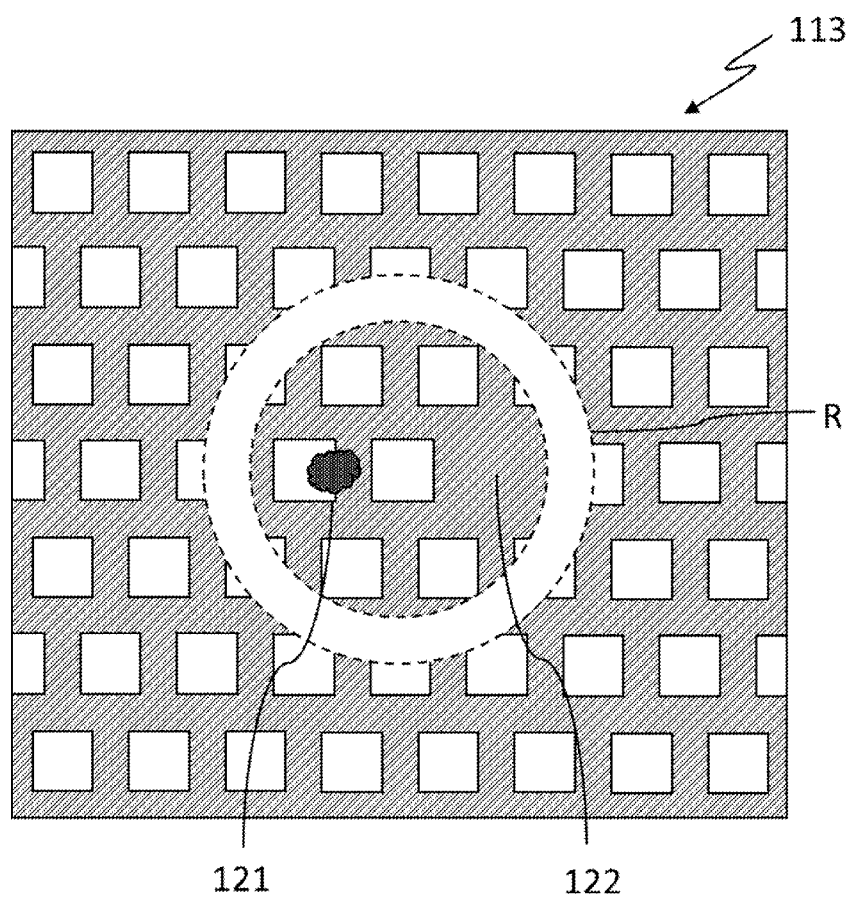
FIG. 1C is a schematic top view illustrating another example configuration of gate electrode 113 in power MOSFET 100 containing process-related defects according to the exemplary embodiment.

FIG. 1C is a schematic top view illustrating another example configuration of gate electrode 113 in power MOSFET 100 containing process-related defects according to the exemplary embodiment. In the example configuration of FIG. 1C, gate electrode 113 is removed in a ring-shaped frame of ineffective region R. A width of the ring-shaped frame is half the distance between centers of two adjacent holes in gate electrode 113. In reality, it is preferable that the width of the ring-shaped frame be 5 μm or greater. In the example configuration of FIG. 1C, gate electrode 113 inside ineffective region R is separated from gate electrode 113 outside ineffective region R. Thus, even if a voltage is applied to gate electrode 113 outside ineffective region R, no voltage is applied to gate electrode 113 inside ineffective region R. This configuration permits the area inside ineffective region R to be always in an off-state. In other words, no leakage current flows between the gate and the source.

This exemplary embodiment is also effective against defects such as a large defect covering a plurality of holes in gate electrode 113, as well as a defect having a substantially uneven surface.

A procedure for manufacturing power MOSFET 100 containing process-related defects will now be described according to the exemplary embodiment.

FIGS. 2A to 2I are cross-sectional views illustrating steps involved in an example method for manufacturing power MOSFET 100 containing process-related defects according to the exemplary embodiment.

Figure 2A:
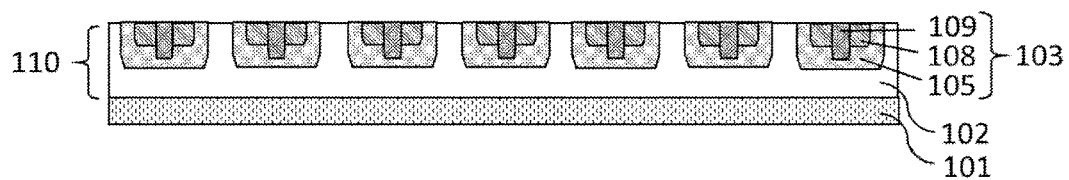
FIG. 2A is a cross-sectional view illustrating a step involved in an example method for manufacturing power MOSFET 100 containing process-related defects according to the exemplary embodiment.

With reference to FIG. 2A, semiconductor layer 110 is formed on semiconductor substrate 101 (e.g., an N$^+$ type SiC or GaN substrate). Semiconductor layer 110 includes drift region 102 (e.g., an N$^-$ type drift region). Ions are implanted into the surface of semiconductor layer 110 remote from semiconductor substrate 101 such that two-dimensionally distributed well regions 103 are formed in the same surface. Well regions 103 each include body region 105 (e.g., a P$^+$ doped region), source region 108 (e.g., an N$^+$ doped region), and contact region 109. While well regions 103 are formed by ion implantation, a process-related defect (e.g., non-formation of source region 108) can be produced.

Figure 2B:
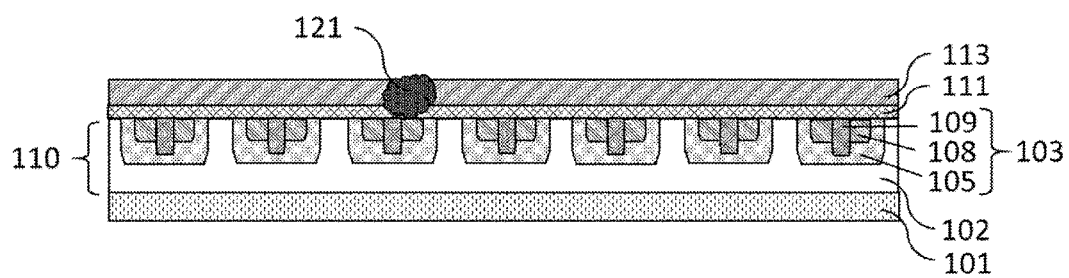
FIG. 2B is a cross-sectional view illustrating a step involved in the example method for manufacturing power MOSFET 100 containing process-related defects according to the exemplary embodiment.

With reference to FIG. 2B, gate insulating layer (gate oxide film) 111 and gate electrode 113 are formed on semiconductor layer 110 in this order. During this formation, conductive or non-conductive foreign substance 121 can stick to gate insulating layer 111 or gate electrode 113.

Figure 2C:
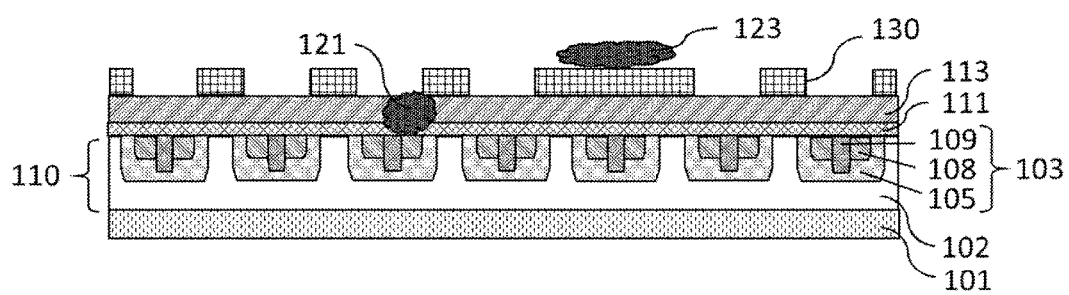
FIG. 2C is a cross-sectional view illustrating a step involved in the example method for manufacturing power MOSFET 100 containing process-related defects according to the exemplary embodiment.

With reference to FIG. 2C, resist 130 is applied to gate electrode 113. Part of resist 130 overlapping source regions 108 and contact regions 109 of well regions 103 is removed. In the process, other foreign substance 123 can stick to resist 130.

Figure 2D:
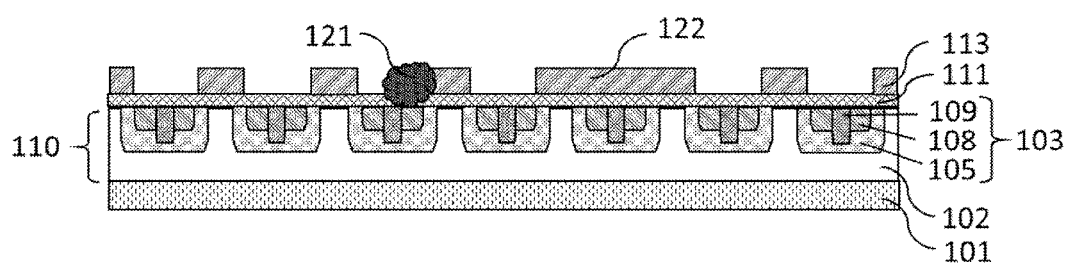
FIG. 2D is a cross-sectional view illustrating a step involved in the example method for manufacturing power MOSFET 100 containing process-related defects according to the exemplary embodiment.

With reference to FIG. 2D, part of gate electrode 113 where no resist 130 is put on is removed by dry etching. After that, resist 130 is removed. Process-related defects that have been produced during the steps described above, such as foreign substance 121 and pattern defect 122 in gate electrode 113, are inspected and coordinates of these process-related defects are recorded. An ineffective region is determined based on the coordinates of the process-related defects. Various defects are observed after the formation of a pattern on gate electrode 113.

Process-related defects can be inspected with an inspection instrument using visible light, infrared light, or photoluminescence. An inspection may be performed with combined use of visible light and infrared light or combined use of visible light and photoluminescence. Inspections using infrared light or photoluminescence enable identification of defects inside semiconductor layer 110 that are not visible by inspections using visible light. An identification of outside and inside defects with increased accuracy prevents a reduction in the yield of a semiconductor device.

Figure 2E:
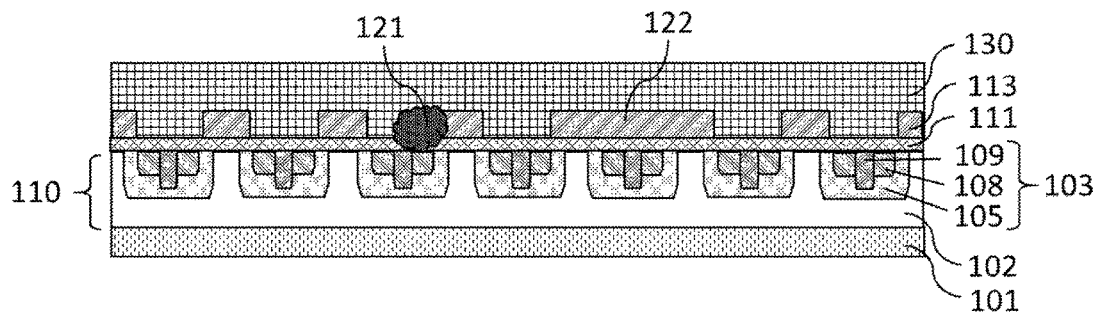
FIG. 2E is a cross-sectional view illustrating a step involved in the example method for manufacturing power MOSFET 100 containing process-related defects according to the exemplary embodiment.

With reference to FIG. 2E, resist 130 is applied to and put on gate insulating layer 111 and gate electrode 113.

Figure 2F:
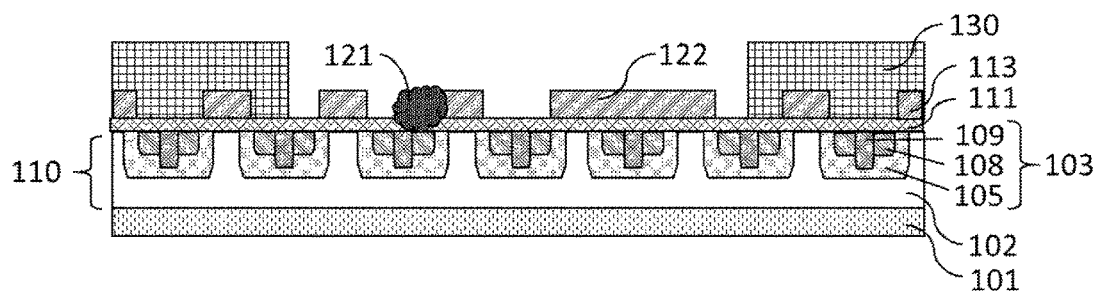
FIG. 2F is a cross-sectional view illustrating a step involved in the example method for manufacturing power MOSFET 100 containing process-related defects according to the exemplary embodiment.

With reference to FIG. 2F, resist 130 is removed in an ineffective region by laser or other processing.

Figure 2G:
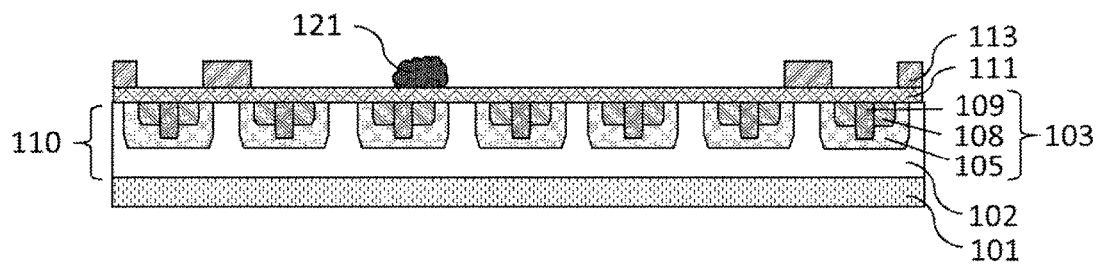
FIG. 2G is a cross-sectional view illustrating a step involved in the example method for manufacturing power MOSFET 100 containing process-related defects according to the exemplary embodiment.

With reference to FIG. 2G, gate electrode 113 is removed in the ineffective region by etching. After that, resist 130 is removed.

The following steps of the manufacturing procedure are performed inside and outside the ineffective region alike.

Insulating film 117 is put on gate insulating layer 111 and gate electrode 113.

Figure 2H:
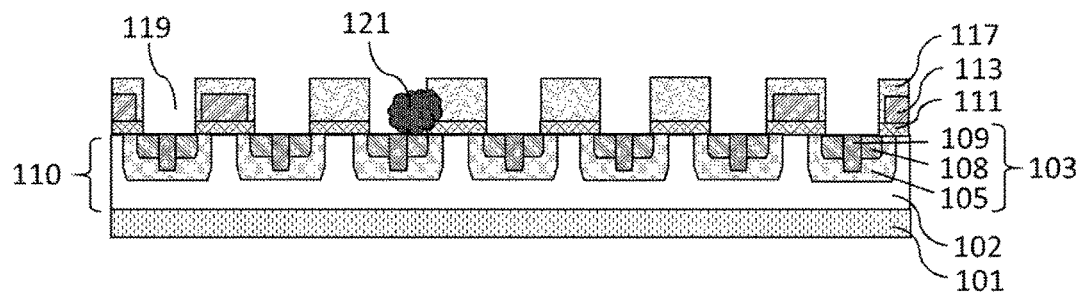
FIG. 2H is a cross-sectional view illustrating a step involved in the example method for manufacturing power MOSFET 100 containing process-related defects according to the exemplary embodiment.

With reference to FIG. 2H, part of gate insulating layer 111 and insulating film 117 overlapping at least part of source region 108 and contact region 109 of every well region 103 is removed. This process forms source contact holes 119 to expose at least part of source region 108 and contact region 109 of every well region 103.

Figure 2I:
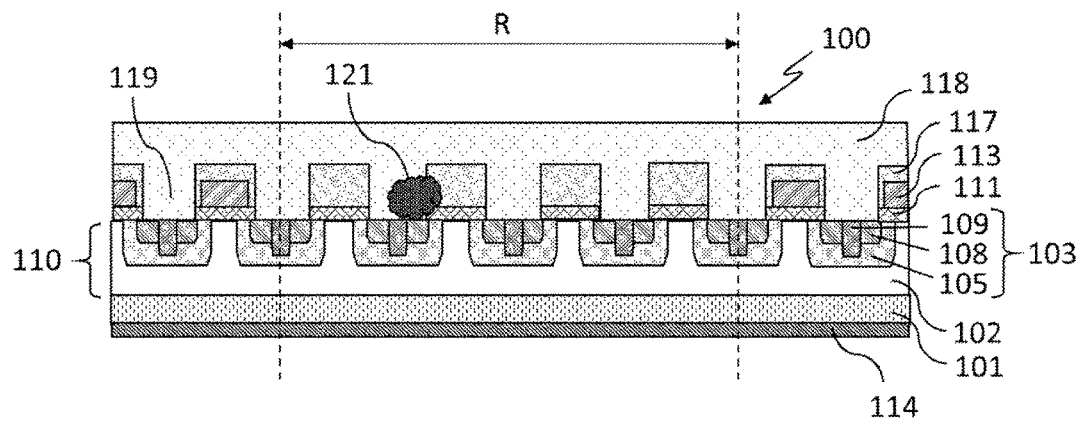
FIG. 2I is a cross-sectional view illustrating a step involved in the example method for manufacturing power MOSFET 100 containing process-related defects according to the exemplary embodiment.

With reference to FIG. 2I, source wire 118 is formed such that source wire 118 is put on insulating film 117 and in contact with exposed source regions 108 and contact regions 109 of well regions 103. In addition, drain electrode 114 is formed on the surface of semiconductor substrate 101 remote from semiconductor layer 110.

Through the steps described above, power MOSFET 100 containing process-related defects is manufactured according to the exemplary embodiment. In this manufacturing method, after removal of gate electrode 113 in the ineffective region, the steps of the manufacturing procedure can be performed inside and outside the ineffective region alike. This facilitates the manufacturing of power MOSFET 100.

The following description is given of a configuration (see FIG. 2G) in which gate electrode 113 in the ineffective region are removed from gate electrode 113 with process-related defects (see FIG. 2D).

Figure 3A:
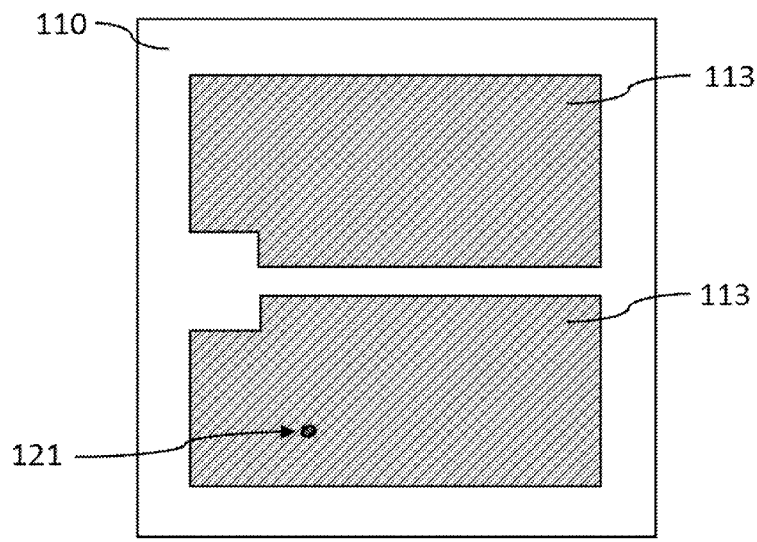
FIG. 3A is a schematic top view illustrating gate electrode 113 having sticking foreign substance 121.
Figure 3B:
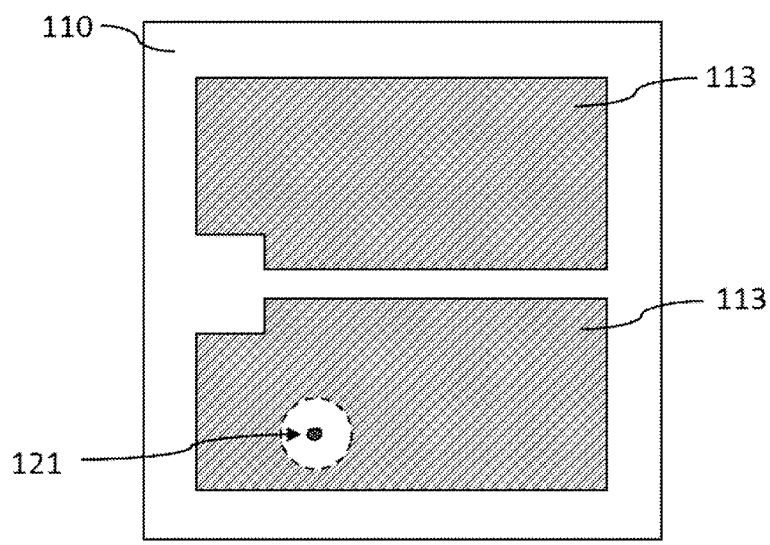
FIG. 3B is a schematic top view illustrating a removed part of gate electrode 113 in the vicinity of foreign substance 121.

FIG. 3A is a schematic top view illustrating gate electrode 113 having sticking foreign substance 121. FIG. 3B is a schematic top view illustrating a removed part of gate electrode 113 in the vicinity of foreign substance 121. FIGS. 3A and 3B each omit illustration of a mesh structure of gate electrode 113.

Gate electrode 113 is divided into two pieces at a border in a neighborhood of the middle of the surface of semiconductor layer 110. A gate wire is formed in the neighborhood of the middle of the surface so as to extend over the two pieces of gate electrode 113 and as a result, a voltage can be applied to the two pieces of gate electrode 113. None of well regions 103 is formed below the gate wire. After insulating film 117 is formed and covered gate electrode 113, source wire 118 is formed and put on insulating film 117. It is preferable that an upper surface of the gate wire and an upper surface of source wire 118 be at an identical level.

Gate electrodes 113 in FIGS. 3A and 3B correspond to gate electrodes 113 in the steps of FIGS. 2D and 2G, respectively. FIG. 8A shows an optical microscopic photograph of foreign substance 121 in FIG. 3A. Tests conducted by the inventor of the present disclosure confirmed that no leakage current flows between the gate and the source of power MOSFET 100 if a part of gate electrode 113 in the vicinity of foreign substance 121 (a region enclosed with a circle in FIG. 3B) is locally removed.

Figure 4A:
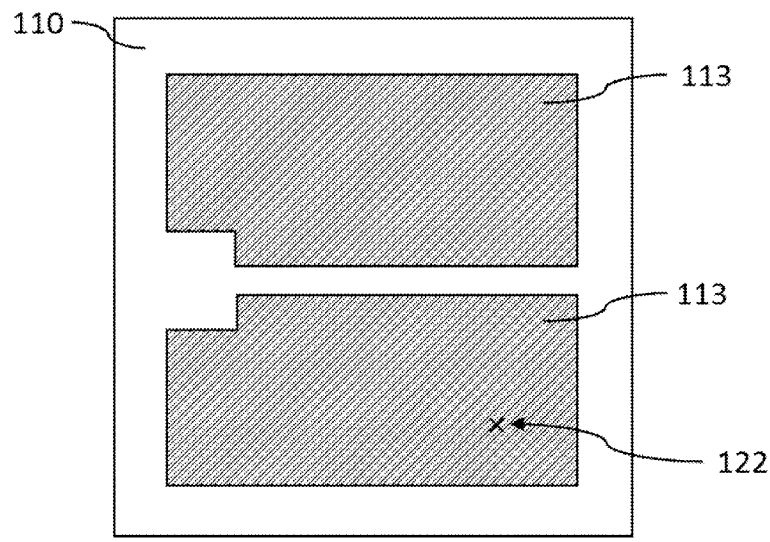
FIG. 4A is a schematic top view illustrating gate electrode 113 having pattern defect 122.
Figure 4B:
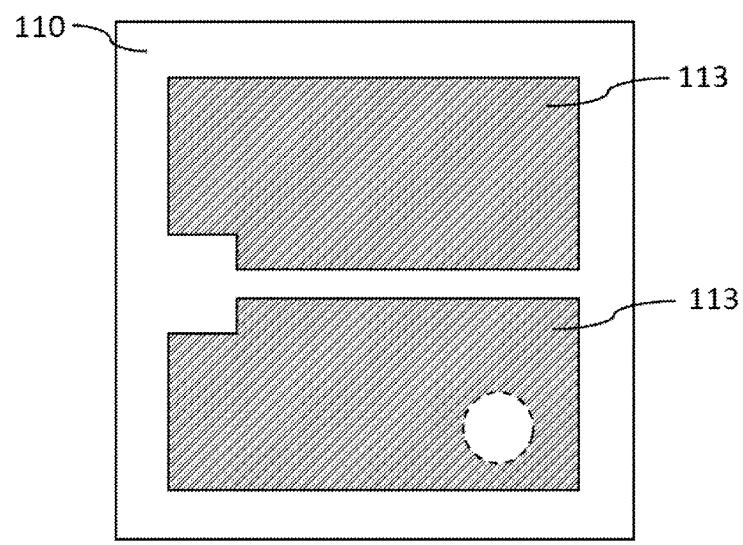
FIG. 4B is a schematic top view illustrating a removed part of gate electrode 113 in the vicinity of pattern defect 122.

Similarly, FIG. 4A is a schematic top view illustrating gate electrode 113 having pattern defect 122. FIG. 4B is a schematic top view illustrating a removed part of gate electrode 113 in vicinity of pattern defect 122. A symbol x indicates pattern defect 122.

Gate electrodes 113 in FIGS. 4A and 4B correspond to gate electrodes 113 in the steps of FIGS. 2D and 2G, respectively. FIG. 8B shows an enlarged view of pattern defect 122 in FIG. 4A. Tests conducted by the inventor of the present disclosure confirmed that no leakage current flows between the gate and the source of power MOSFET 100 if a part of gate electrode 113 in the vicinity of pattern defect 122 (a region enclosed with a circle in FIG. 4B) is locally removed.

A modification of the exemplary embodiment will now be described. Descriptions of components identical to those described above may be omitted.

Figure 5:
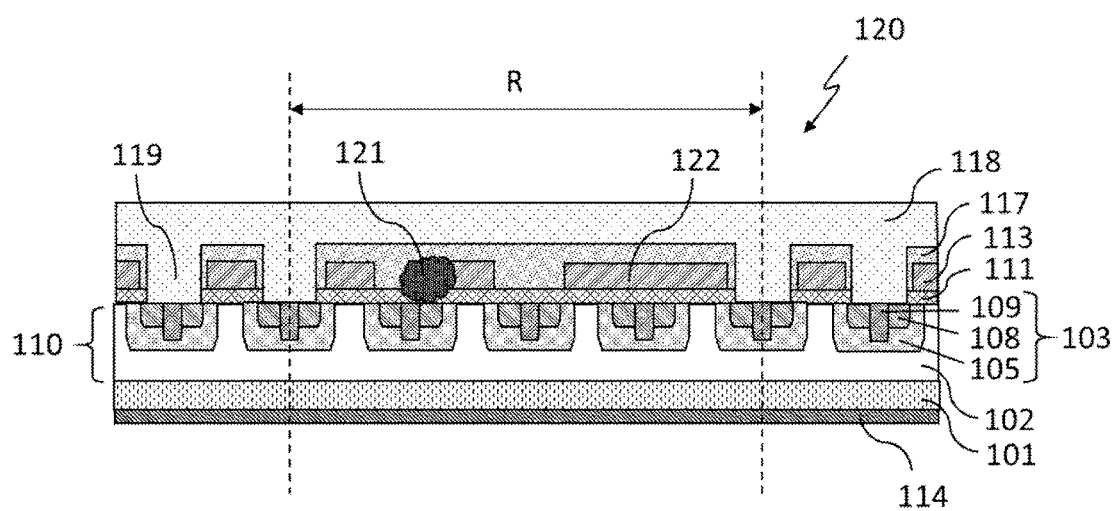
FIG. 5 is a schematic cross-sectional view illustrating an example configuration of power MOSFET 120 containing process-related defects according to the exemplary embodiment.

FIG. 5 is a schematic cross-sectional view illustrating an example configuration of power MOSFET 120 containing process-related defects according to the exemplary embodiment.

Power MOSFET 120 includes semiconductor substrate 101, semiconductor layer 110, gate insulating layer 111, gate electrode 113, insulating film 117, source wire 118, and drain electrode 114.

A configuration of semiconductor layer 110 is the same as the configuration of semiconductor layer 110 in FIG. 1 A according to the exemplary embodiment.

Gate insulating layer 111 is formed on semiconductor layer 110. Gate insulating layer 111 exposes at least part of source region 108 and contact region 109 of every well region 103, (which corresponds to source contact hole 119), outside ineffective region R. Gate insulating layer 111 exposes none of source regions 108 and contact regions 109 of well regions 103 inside ineffective region R.

In the present specification, the scope of "gate insulating layer 111 exposes none of source regions 108 and contact regions 109 of well regions 103 inside ineffective region R" includes cases in which part of source regions 108 and contact regions 109 of well regions 103 are exposed near the edge of ineffective region R although none of source regions 108 and contact regions 109 is exposed in the rest of ineffective region R.

Gate electrode 113 is formed on gate insulating layer 111 both inside and outside ineffective region R.

Insulating film 117 is put on gate electrode 113 outside ineffective region R. Insulating film 117 is put on gate electrode 113 and at least part of gate insulating layer 111 inside ineffective region R.

Source wire 118 is put on insulating film 117 both inside and outside ineffective region R. Source wire 118 is in contact with exposed source regions 108 and contact regions 109 of well regions 103 through source contact holes 119 outside ineffective region R.

Drain electrode 114 is formed on a surface of semiconductor substrate 101 remote from semiconductor layer 110.

Ineffective region R covers a range as described above.

In the example configuration of FIG. 5, conductive or non-conductive foreign substance 121 exists at least one of above, below, and inside gate insulating layer 111 within ineffective region R. Gate electrode 113 overlaps at least part of source regions 108 and contact regions 109 of well regions 103 through gate insulating layer 111 inside ineffective region R.

Because of no formation of source contact hole 119 inside ineffective region R, gate electrode 113 and source wire 118 are not electrically connected to each other and thus ineffective region R is always in an off-state even if foreign substance 121 or pattern defect 122 in gate electrode 113 exists over gate insulating layer 111. In other words, no process-related defect causes a leakage current to flow between the gate and the source. This configuration prevents any process-related defect from causing a reduction in the yield of power MOSFET 120.

A procedure for manufacturing power MOSFET 120 containing process-related defects will now be described according to the exemplary embodiment.

FIGS. 6A to 6I are cross-sectional views illustrating steps involved in an example method for manufacturing power MOSFET 120 containing process-related defects according to the exemplary embodiment.

Steps illustrated in FIGS. 6A to 6D are the same as the steps of FIGS. 2A to 2D.

Figure 6A:
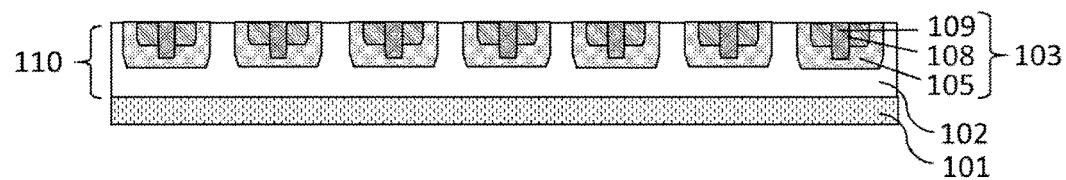
FIG. 6A is a cross-sectional view illustrating a step involved in an example method for manufacturing power MOSFET 120 containing process-related defects according to the exemplary embodiment.
Figure 6B:
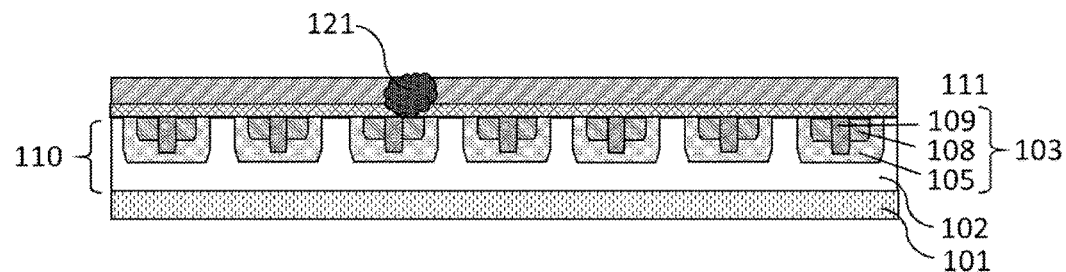
FIG. 6B is a cross-sectional view illustrating a step involved in the example method for manufacturing power MOSFET 120 containing process-related defects according to the exemplary embodiment.
Figure 6C:
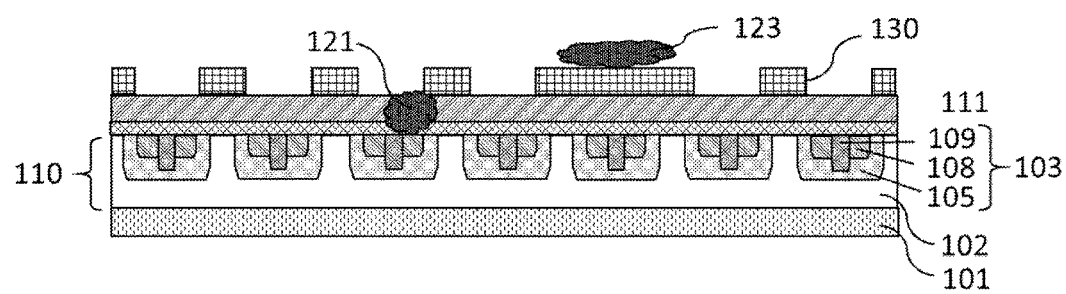
FIG. 6C is a cross-sectional view illustrating a step involved in the example method for manufacturing power MOSFET 120 containing process-related defects according to the exemplary embodiment.
Figure 6D:
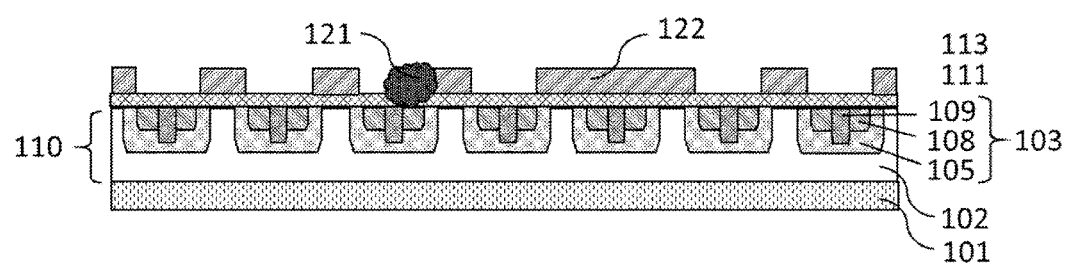
FIG. 6D is a cross-sectional view illustrating a step involved in the example method for manufacturing power MOSFET 120 containing process-related defects according to the exemplary embodiment.
Figure 6E:
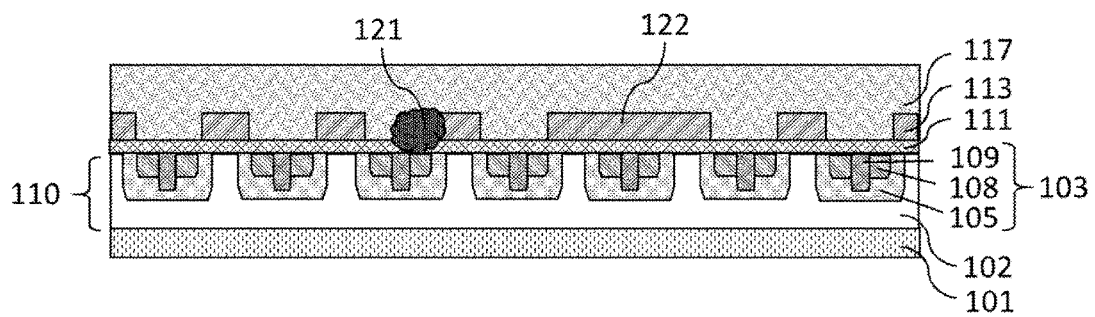
FIG. 6E is a cross-sectional view illustrating a step involved in the example method for manufacturing power MOSFET 120 containing process-related defects according to the exemplary embodiment.

With reference to FIG. 6E, insulating film 117 is covered gate insulating layer 111 and gate electrode 113 both inside and outside the ineffective region.

Figure 6F:
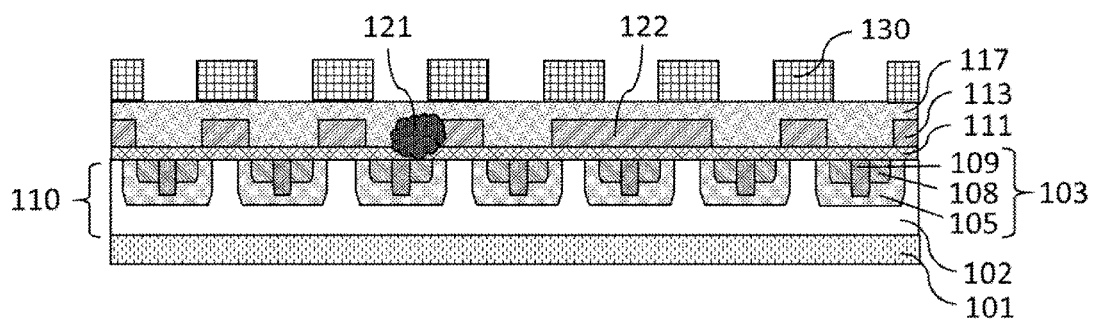
FIG. 6F is a cross-sectional view illustrating a step involved in the example method for manufacturing power MOSFET 120 containing process-related defects according to the exemplary embodiment.

With reference to FIG. 6F, resist 130 is formed on insulating film 117. A pattern for source contact holes 119 is formed in resist 130.

Figure 6G:
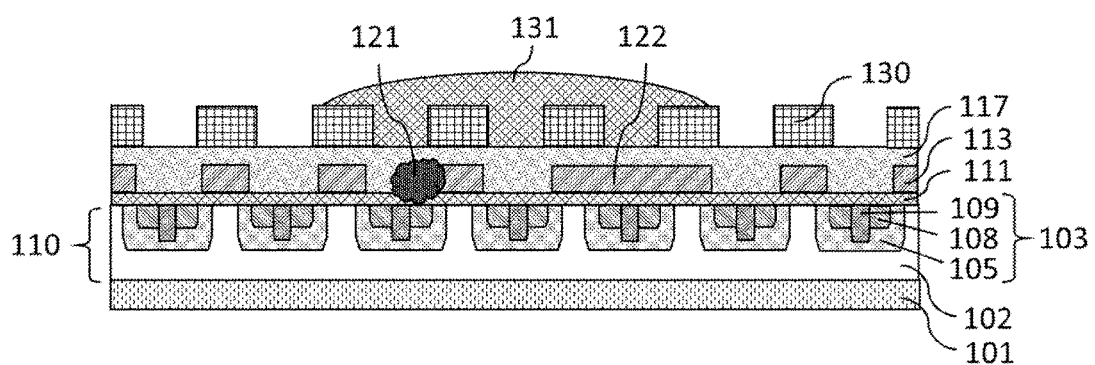
FIG. 6G is a cross-sectional view illustrating a step involved in the example method for manufacturing power MOSFET 120 containing process-related defects according to the exemplary embodiment.

With reference to FIG. 6G, other resist 131 is additionally formed inside the ineffective region. This process prevents insulating film 117 beneath other resist 131 from being removed even if etching is performed both inside and outside the ineffective region. Other resist 131 is locally formed using a method of discharging a resist with a dispenser, for example.

The following steps of the manufacturing procedure are performed inside and outside the ineffective region alike. However, because of other resist 131, power MOSFET 120 has structural differences between inside and outside the ineffective region.

Figure 6H:
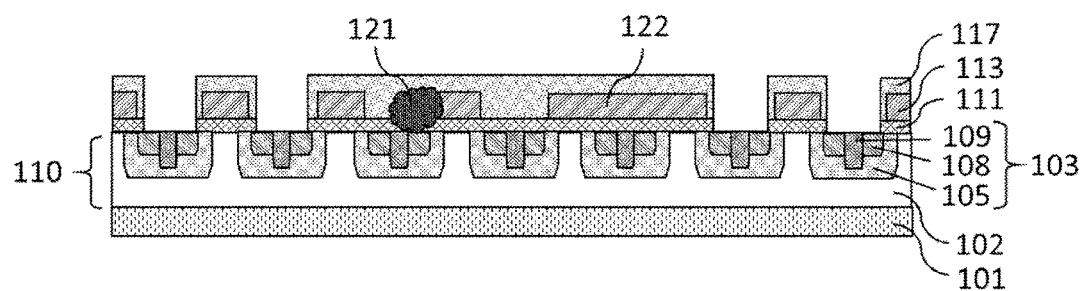
FIG. 6H is a cross-sectional view illustrating a step involved in the example method for manufacturing power MOSFET 120 containing process-related defects according to the exemplary embodiment.

With reference to FIG. 6H, etching is performed outside the ineffective region so as to remove part of gate insulating layer 111 and insulating film 117 overlapping at least part of source region 108 and contact region 109 of every well region 103. This process forms source contact holes 119 to expose at least part of source region 108 and contact region 109 of every well region 103 outside the ineffective region. Meanwhile, no source contact hole 119 is formed and none of source regions 108 and contact regions 109 of well regions 103 is exposed inside the ineffective region owing to other resist 131 even if etching is performed. After the etching process, resists 130, 131 are removed.

In the present specification, the scope of "no source contact hole 119 is formed inside the ineffective region" includes cases in which source contact hole 119 is formed near the edge of the ineffective region although no source contact hole 119 is formed in the rest of the ineffective region.

Figure 6I:
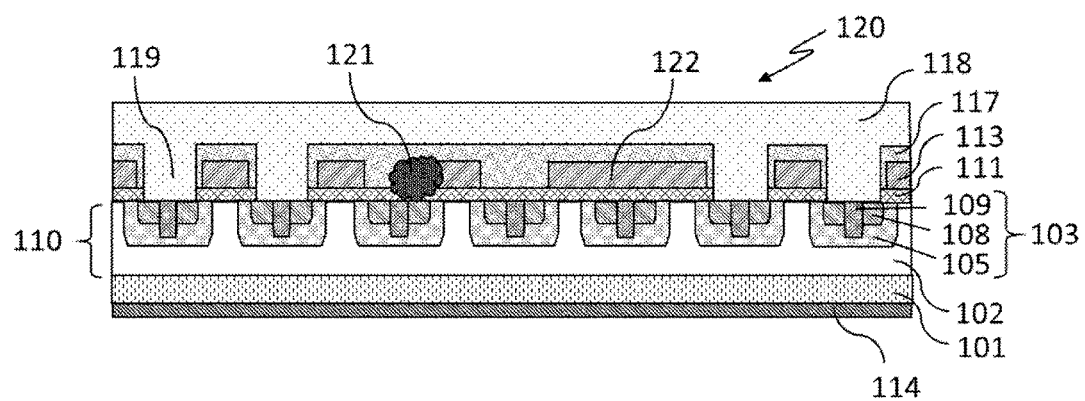
FIG. 6I is a cross-sectional view illustrating a step involved in the example method for manufacturing power MOSFET 120 containing process-related defects according to the exemplary embodiment.

With reference to FIG. 6I, source wire 118 is formed such that source wire 118 is put on insulating film 117 both inside and outside the ineffective region and is in contact with exposed source regions 108 and contact regions 109 of well regions 103 through source contact holes 119 outside the ineffective region. In addition, drain electrode 114 is formed on the surface of semiconductor substrate 101 remote from semiconductor layer 110.

Through the steps described above, power MOSFET 120 containing process-related defects is manufactured according to the exemplary embodiment. In this manufacturing method, after application of other resist 131 inside the ineffective region, the steps of the manufacturing procedure can be performed inside and outside the ineffective region alike. This facilitates the manufacturing of power MOSFET 120.

In the above examples, the exemplary embodiment has been described with attention focused on process-related defects. Technique in the exemplary embodiment can also be applied to crystalline defects. In this case, in the step of FIG. 2A or FIG. 6A, crystalline defects may be inspected, coordinates of these crystalline defects may be recorded, and an ineffective region may be determined based on the coordinates of the crystalline defects. The crystalline defects can be inspected with the inspection instrument described in the step of FIG. 2D.

A gate electrode may be removed from at least one of an ineffective region determined with process-related defects and the ineffective region determined with the crystalline defects. Alternatively, no source contact hole may be formed inside at least one of these ineffective regions. This process reduces the occurrence of a leakage current flowing between the gate and the source. This in turn prevents a reduction in yield.

A semiconductor device and a method for manufacturing the semiconductor device according to an exemplary embodiment of the present disclosure can find application in such products as power devices.

What is claimed is:

1. A method for manufacturing a semiconductor device, the method comprising:
   a first step of preparing:
      a semiconductor substrate;
      a semiconductor layer disposed on the semiconductor substrate, the semiconductor layer comprising:
         a plurality of well regions in top portions remote from the semiconductor substrate, the plurality of well regions each including a source region; and
         a drift region in a part other than the plurality of well regions;
      a gate insulating layer disposed on the semiconductor layer; and
      a gate electrode disposed on the gate insulating layer;
   a second step of removing part of the gate electrode overlapping each of the source regions of the plurality of well regions;
   a third step of inspecting a defect produced in any of the first and the second steps, recording coordinates of the defect, and determining an ineffective region based on the coordinates of the defect;
   a fourth step of removing the gate electrode in the ineffective region;
   a fifth step of forming an insulating film on the gate electrode outside the ineffective region, forming the insulating film on at least part of the gate insulating layer inside the ineffective region, and forming two or more source contact holes in the insulating film both inside and outside the ineffective region so as to expose at least part of each of the source regions of the plurality of well regions; and
   a sixth step of forming a source wire such that the source wire is covered the insulating film and is in contact with the exposed source regions of the plurality of well regions through the source contact holes both inside and outside the ineffective region.

2. A method for manufacturing a semiconductor device, the method comprising:
   a first step of preparing:
      a semiconductor substrate;
      a semiconductor layer disposed on the semiconductor substrate, the semiconductor layer comprising:
         a plurality of well regions in a surface remote from the semiconductor substrate, the plurality of well regions each including a source region; and
         a drift region in a part other than the plurality of the well regions;
      a gate insulating layer disposed on the semiconductor layer; and
      a gate electrode disposed on the gate insulating layer;
   a second step of removing part of the gate electrode overlapping each of the source regions of the plurality of well regions;
   a third step of inspecting a defect produced in any of the first and the second steps, recording coordinates of the defect, and determining an ineffective region based on the coordinates of the defect;
   a fourth step of putting an insulating film on the gate insulating layer and the gate electrode formed through the second step both inside and outside the ineffective region, forming two or more source contact holes in the insulating film outside the ineffective region so as to expose at least part of each of the source regions of the plurality of well regions outside the ineffective region, and forming no source contact hole in the insulating film inside the ineffective region so as to expose none of the source regions of the plurality of well regions inside the ineffective region; and
   a fifth step of forming a source wire such that the source wire is covered the insulating film both inside and outside the ineffective region and is in contact with the exposed source regions of the plurality of well regions through the source contact holes outside the ineffective region.

* * * * *